United States Patent
Etkin

(10) Patent No.: US 8,392,800 B2
(45) Date of Patent: Mar. 5, 2013

(54) MULTI-HOP NETWORK HAVING INCREASED RELIABILITY

(75) Inventor: Raul Hernan Etkin, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 712 days.

(21) Appl. No.: 12/582,035

(22) Filed: Oct. 20, 2009

(65) Prior Publication Data
US 2011/0093758 A1 Apr. 21, 2011

(51) Int. Cl.
*G06F 11/00* (2006.01)
(52) U.S. Cl. .................................................... 714/774
(58) Field of Classification Search ................. 714/774
See application file for complete search history.

(56) References Cited

U.S. PATENT DOCUMENTS

| | | | |
|---|---|---|---|
| 5,617,541 A * | 4/1997 | Albanese et al. ............. 709/207 |
| 6,317,462 B1 * | 11/2001 | Boyce ...................... 375/240.27 |
| 6,675,340 B1 * | 1/2004 | Hardie et al. ................. 714/751 |
| 2005/0249215 A1 | 11/2005 | Kelsey et al. |
| 2005/0249240 A1 * | 11/2005 | Boyce et al. .................. 370/469 |
| 2008/0225892 A1 * | 9/2008 | Vare et al. .................... 370/473 |
| 2009/0141667 A1 | 6/2009 | Jin et al. |
| 2011/0134845 A1 * | 6/2011 | Henderson et al. .......... 370/328 |

* cited by examiner

*Primary Examiner* — Bryce Bonzo

(57) ABSTRACT

The present disclosure is directed to networks having increased reliability and associated methods. In one aspect, a method for increasing reliability of a multi-hop network can include generating an erasure correction packet from a data packet using an encoder system, and splitting the erasure correction packet into a plurality of erasure correction subpackets. The erasure correction subpackets can then be transmitted across a plurality of network paths of a multi-node network using a communication system. The method can also include identifying successfully received erasure correction subpackets, and regenerating the data packet from the successfully received erasure correction subpackets using a data aggregation system and a decoder system.

24 Claims, 3 Drawing Sheets

MULTI-HOP NETWORK HAVING INCREASED RELIABILITY

BACKGROUND

In multi-hop wireless networks, nodes relay each other's data from node to node (i.e. a hop) until reaching a destination. Data packets can be lost due to various factors, including decoding errors due to noise and random channel fading, buffer overflows, node failures, uncorrectable errors, timeouts, reaching a maximum number of retransmissions, routing problems, and the like. While packet-based forward error correction (FEC), where redundant information is added to each packet in order to correct some bit error patterns, and hop-wise automatic repeat request (ARQ) methods can be effective for dealing with noise and random channel fluctuations, these methods often do not prevent data packet losses due to buffer overflows and/or complete node failure. Additionally, end-to-end ARQ methods can incur significant delays and overhead, and may not be practical for a number of networking applications.

DETAILED DESCRIPTION

Figure 1:
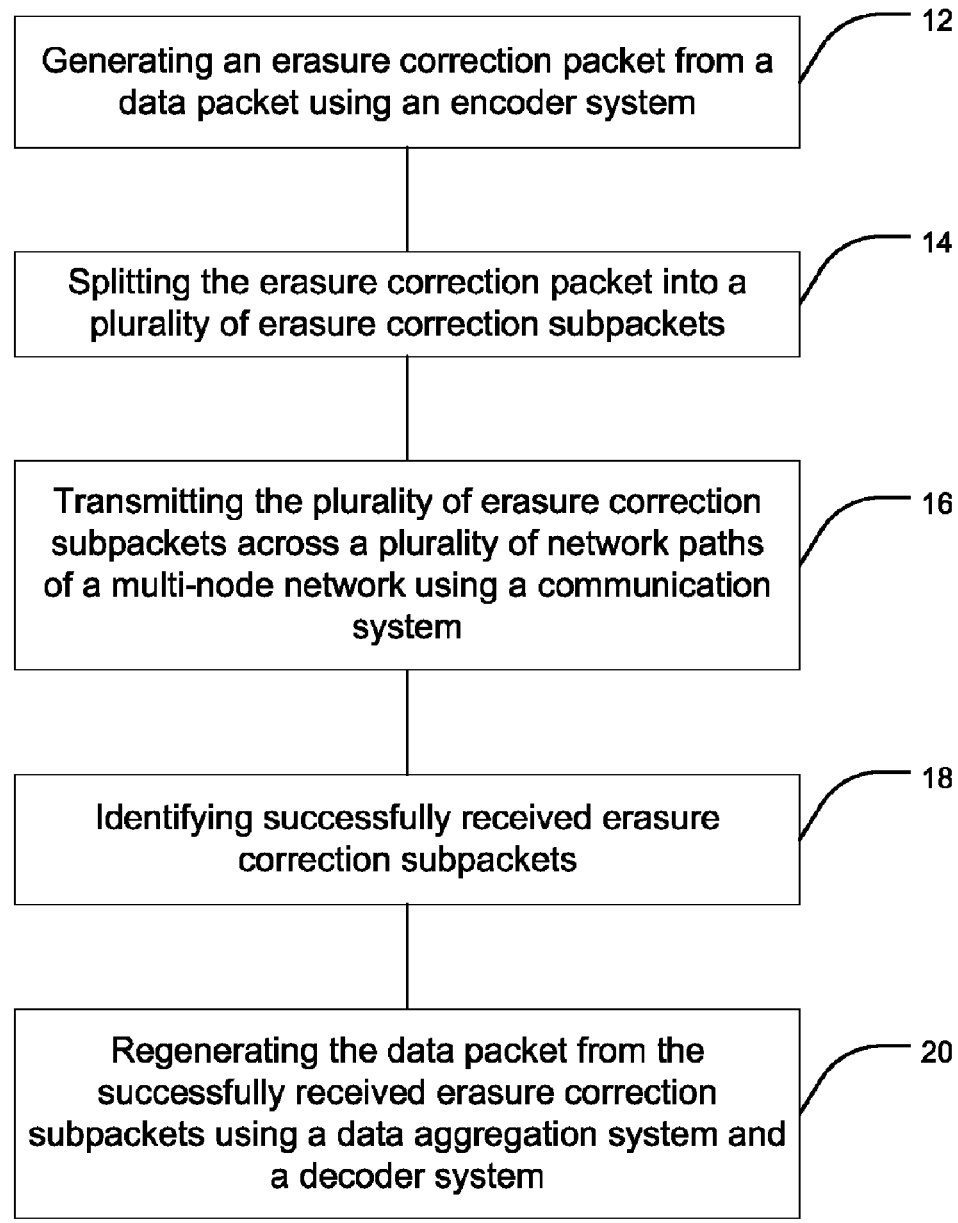
FIG. 1 depicts a method for increasing reliability of a multi-hop network in accordance with one embodiment of the present disclosure.

Before the present technology is disclosed and described, it is to be understood that this technology is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

In describing and claiming the present technology, the following terminology will be used in accordance with the definitions set forth below.

It is noted that, as used herein, the singular forms of "a," "an," and "the" include plural referents unless the context clearly dictates otherwise. Thus, for example, reference to "a node" includes one or more of such nodes; reference to "an erasure correcting code" includes reference to one or more such codes; and reference to "the decoder system" includes reference to one or more such systems.

As used herein, the term "about" is used to provide flexibility to a numerical range endpoint by providing that a given value may be "a little above" or "a little below" the endpoint. The degree of flexibility of this term can be dictated by the particular variable and would be within the knowledge of those skilled in the art to determine based on experience and the associated description herein.

As used herein, the term "lost erasure correction subpacket" refers to an erasure correction subpacket that has not been successfully transmitted along a network path. In one aspect, a lost erasure correction subpacket can be a subpacket that has been lost during transmission. Such a loss can occur due to a variety of factors, including, without limitation, buffer overruns, node failures, and the like.

As is used herein, the term "corrupted erasure correction subpacket" refers to an erasure correction subpacket that has been transmitted along a network path, but has been corrupted by transmission errors to the extent that correction of the subpacket is beneficial.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

The present technology is directed to multi-hop networks having increased reliability, including methods that are associated with such networks. It should be noted that these networks can be wireless, wired, or a combination of wireless and wired. These networks particularly exhibit such increased reliability by recovering data information that has been lost due to various types of error events, such as uncorrectable packet errors, buffer overflows, node failures, and the like. In particular, such networks allow the recovery of data information within a given time delay constraint, and without incurring significant communication overhead.

As has been described, a typical multi-hop network uses packet-based forward error correction (FEC) and hop-wise automatic repeat request (ARQ) correction to detect and correct transmission errors on a data packet and hop basis. Many known FEC-based methods, for example, add redundant information to each data packet so that some bit errors can be detected and/or corrected. In one ARQ-based method, feedback from a receiver node to a transmitter node is used to acknowledge (ACK) the correct reception of each data packet. A data packet can then be retransmitted when uncorrectable errors and/or data packet losses are detected. In another ARQ-based method, a negative acknowledgment (NAK) can be sent after a packet has not been received within a given time period. FEC and ARQ methods can be effective in dealing with decoding errors due to noise, interference, crosstalk, imperfect synchronization, and wireless channel fluctuations (multipath fading, shadowing), but these methods cannot recover information lost due to buffer overflows or node malfunctions, such as, for example, a loss of node power.

End-to-end ARQ methods, such as those used in the Internet, are capable of recovering information lost due to buffer overflows and node failures, but have poor performance when the number of hops separating the transmitter from the receiver is large. The reason for such poor performance is related to long delays and feedback overheads. If the end-to-end delay is t, for example, a retransmitted packet arrives at the destination with a delay 3 t or larger, which may be unacceptable for delay sensitive applications, particularly when t is large. In addition, end-to-end feedback of acknowledgment (ACK) packets may present significant overhead, especially in sensing and/or data collecting applications where communication can be mainly upstream from sensors to data collection center, and where there is little downstream data with which to piggyback the ACKs.

Finally, smart multi-hop networking protocols can dynamically reconfigure routes when node failures or other communication problems are detected. However, routing updates can only fix connectivity issues for future data packets and cannot recover previously lost data packets.

As is shown in FIG. 1, one embodiment of a method for increasing reliability of a multi-hop network is provided. Such a method can include generating an erasure correction packet from a data packet using an encoder system 12 and an erasure correction code. A variety of encoding techniques utilizing erasure correction codes for generating an erasure correction packet from the data packet are contemplated, and any such method should be considered to be within the present scope. Non-limiting examples of such techniques include parity checking, polynomial oversampling, fountain codes, online codes, tornado codes, raptor codes, Luby transform codes, low density parity check (LDPC) codes, including expander codes, Bose, Ray-Chaudhuri, Hocquenghem (BCH) codes, including Reed Solomon codes, and the like. In one specific aspect, the erasure correction code can be a BHC code. In another specific aspect, the erasure correction code can be a Reed Solomon code.

In some embodiments, the erasure correction packet can be further encoded as a protection against channel transmission errors, and further protections such as checksums can be utilized. These and other protective techniques would be understood by those skilled in the relevant art.

The method also includes splitting the erasure correction packet into a plurality of erasure correction subpackets 14, and transmitting the plurality of erasure correction subpackets across a plurality of network paths of a multi-node network using a communication system 16. The network paths can be wireless, wired, or a combination of wired and wireless.

The method can subsequently include identifying successfully received erasure correction subpackets 18. A successfully received erasure correction subpacket is a subpacket that has been received at a network destination and is neither a lost erasure correction subpacket nor a corrupted erasure correction subpacket. The data packet can then be regenerated from the successfully received erasure correction subpackets using a data aggregation system and a decoder system 20. Thus the successfully received erasure corrections subpackets can be aggregated and utilized to regenerate the original data packet, provided that sufficient subpackets are available. It should be noted that the present scope includes embodiments in which aggregating the successfully received erasure corrections subpackets occurs prior to regenerating the data packet, and embodiments in which the aggregation of the successfully received erasure corrections subpackets and the regeneration of the data packet occur simultaneously. The data packet can then be regenerated from the successfully received erasure correction subpackets by, for example, reversing the encoding used to generate the erasure correction packet from the original data packet. The erasure correction code thus allows lost erasure correction subpacket data to be recreated from the successfully received erasure correction subpacket data.

Figure 2:
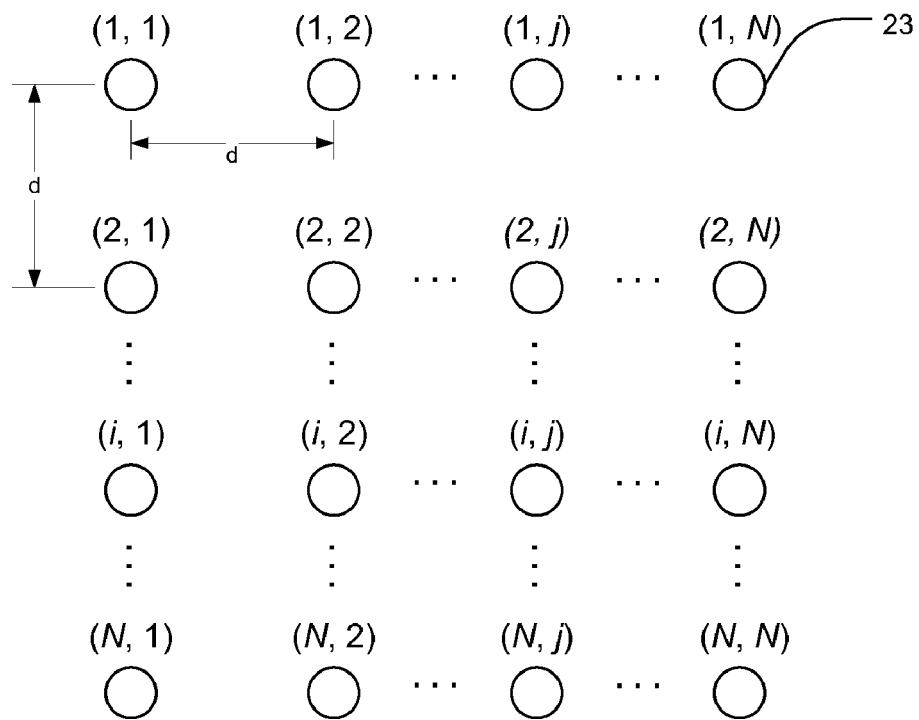
FIG. 2 depicts a network layout in accordance with another embodiment of the present disclosure.

For the sake of simplicity, a multi-hop network can be illustrated as is shown in FIG. 2, where nodes 23 are positioned in a regular two-dimensional array with space d between the nodes. It should be noted that this two-dimensional array is meant to be merely exemplary, and network arrays having one-, two-, and three-dimensional configurations are additionally within the present scope. Additionally, the regular spacing of the nodes in FIG. 2 is also merely exemplary. The present scope should include node arrays having irregular as well as regular node spacing.

Referring again to FIG. 2, the network can be described mathematically as follows: let Equation 1 be the node located in row i and column j of the network array.

$$(i,j) \epsilon [1,N] \times [1,N] \qquad \text{Equation 1}$$

Figure 3:
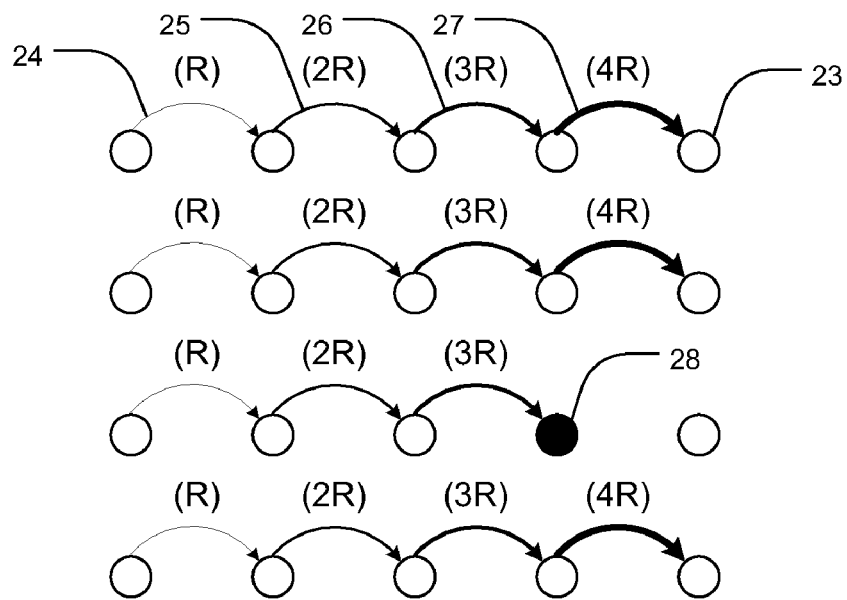
FIG. 3 depicts a network layout showing routing and failure of a node in accordance with yet another embodiment of the present disclosure.

In some existing network arrays, each node sends data to nearest neighbors in a stepwise fashion, as is shown in FIG. 3. In other words, each node (i, j) sends data to a number of stepwise nearest neighbor nodes (i, s), where s=j+1, j+2 . . . , N. Thus the data from node (i, j) is relayed by nodes (i, j+1), (i, j+2), . . . , (i, N−1) until reaching node (i, N). It is assumed that each node needs to send data at a rate of R [bits/sec], and node (i, k) needs to transmit on its own wireless link at a rate of kR to accommodate the transmission of the node's own data plus the data that is being relayed from nearest neighbor nodes. As is shown in FIG. 3, for example, the overall data rate for a first node hop 24 is R, for a second node hope 25 is 2 R, for a third node hope 26 is 3 R, for a fourth node hope 27 is 4 R, and so on.

FIG. 3 also shows a node that has failed 28. In such a situation, the erasure correction subpackets being transmitted along the associated network path can be lost. To avoid data loss, the erasure correction subpackets sent along the network paths that successfully completed transmission can be used to recreate lost subpacket data so that the data packet can be regenerated. To illustrate this concept, a coding scheme capable of recovering lost erasure correction subpacket data is now described. Thus:

$$P=[p(1),\ldots,p(km)] \qquad \text{Equation 2}$$

is an erasure correction packet with:

$$p(j) \epsilon \{0,1\} \qquad \text{Equation 3}$$

that is split into k subpackets:

$$P_i=[p((i-1)m+1),p((i-1)m+2),\ldots,p((i-1)m+m)] \qquad \text{Equation 4}$$

for i=1, . . . , k. An additional (parity) subpacket can be created where the $j^{th}$ bit is computed as the modulo-2 sum of the $j^{th}$ bit of the k subpackets, i.e.:

$$P_{k+1}(j)=[p_1(j) \oplus p_2(j) \ldots \oplus p_k(j)] \qquad \text{Equation 5}$$

where $\oplus$ is binary addition, and the k+1 subpackets are sent over k+1 disjoint network routes. If there is a node failure in the $s^{th}$ network route, the missing $s^{th}$ subpacket can be recovered from the successfully received erasure correction subpackets by computing:

$$P_S(j)=\oplus_{i \neq s} p_i(j) \qquad \text{Equation 6}$$

Once the lost erasure correction subpackets are recovered, the erasure correction packet and ultimately the data packet can be regenerated.

More generally, for any k and n whereby n≧k, an (n, k) erasure correction code, such as those described herein, can be used to encode k subpackets into n subpackets that are sent over n disjoint network routes. In some aspects, erasure correction codes are able to correct up to n−k erasures. That is, if n−k or fewer subpackets are lost, the remaining subpackets can be used to recover the lost subpackets. In one particular embodiment, systematic encoding can be used where the first k erasure correction subpackets coincide with the corresponding symbols of the original data packet. Systematic encoding thus allows recovery of part of the data packet if more than n−k erasures or data subpacket losses occur. It should be noted, however, that the present techniques apply to non-systematic as well as systematic encoding.

After encoding the erasure correction packet using an erasure correction code, each of the n erasure correction subpackets are sent hop-to-hop over different network paths. In one embodiment, existing FEC and ARQ correction schemes are used in a standard hop-to-hop approach, with the goal of detecting and correcting errors that occur due to noise, interference, imperfect synchronization, and fading in the wireless channel, or noise, imperfect synchronization, and crosstalk in the wired channel, and any lost erasure correction subpackets can be regenerated using the present techniques.

In some cases, erasure correction subpackets can contain corruptions following transmission through a network path. In such cases, these "corrupted erasure correction subpackets" can be corrected using a variety of techniques, as is described above. In one aspect, the corrupted erasure correction subpackets can be discarded, and the data contained therein can be regenerated using the successfully received error correction subpackets.

Figure 4:
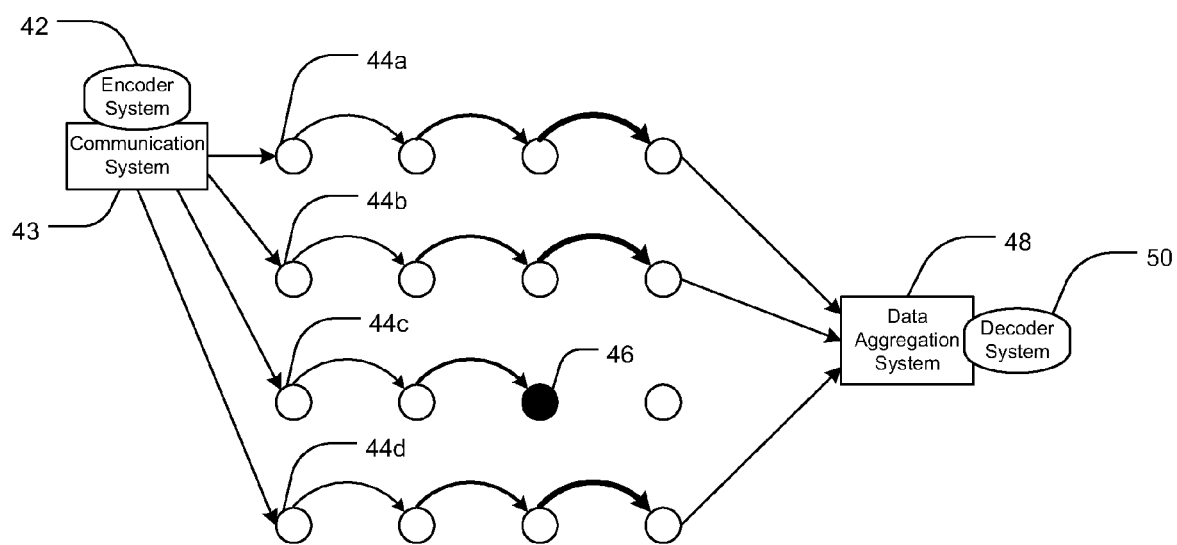
FIG. 4 depicts a network layout including associated systems in accordance with a further embodiment of the present disclosure.

As is shown in FIG. 4, a multi-hop network is provided. Such a network can include an encoder system 42 operable to generate an erasure correction packet from a data packet, and a plurality of nodes forming at least two network paths 44*a-d*. A communication system 43 is operably coupled to the encoder system and to the network paths. The communication system can function to split the erasure correction packet into a plurality of erasure correction subpackets and to transmit the plurality of erasure correction subpackets via the network paths. A break is shown in one of the network paths at 46. At this break point erasure correction subpackets can be lost, and the data contained therein can be regenerated as per the present techniques in order to restore lost data.

Additionally, a data aggregation system 48 is operably coupled to the network paths. The data aggregation system functions to aggregate successfully received erasure correction packets in order to regenerate any data that was lost during transmission. Furthermore, a decoder system 50 is operably coupled to the data aggregation system. The decoder system is capable of regenerating the data packet from the successfully received erasure correction subpackets. The decoder system can be associated with individual nodes, network paths, or a data aggregation system. For those embodiments wherein the decoder system is associated with individual nodes, the identification and reconstruction of lost erasure correction subpacket data can occur at the node, provided the erasure correction code and a sufficient description of the successfully received erasure correction subpacket(s) are communicated to the node from at least a portion of the functioning network. If the decoder system is associated with the data aggregation system, lost erasure correction subpacket data is reconstructed at the data aggregation system. It should be noted that the data aggregation system includes a processor, memory, and circuit logic to accomplish these data aggregation functions.

While the present technology has been described with reference to certain preferred embodiments, those skilled in the art will appreciate that various modifications, changes, omissions, and substitutions can be made without departing from the spirit of the invention. It is therefore intended that the invention be limited only by the scope of the appended claims.

The invention claimed is:

1. A method for increasing reliability of a multi-hop network, comprising:
    receiving, by a receiver system having a processor, erasure correction subpackets from a plurality of network paths traversing multiple nodes of the multi-hop network, wherein the received erasure correction subpackets are a subset of a plurality of erasure correction subpackets split by a transmitter system from an erasure correction packet generated from a data packet;
    recreating, by the receiver system, a lost one of the plurality of erasure correction subpackets using the received erasure correction subpackets; and
    regenerating, by the receiver system, the data packet from the received erasure correction subpackets and the recreated erasure correction subpacket.

2. The method of claim 1, wherein receiving the received erasure correction subpackets includes receiving the received erasure correction subpackets from the plurality of network paths that includes a wireless network path.

3. The method of claim 1, wherein receiving the received erasure correction subpackets includes receiving the received erasure correction subpackets from the plurality of network paths that includes a wired network path.

4. The method of claim 1, wherein receiving the received erasure correction subpackets includes receiving the received erasure correction subpackets from the plurality of network paths that includes a wired network path and a wireless network path.

5. The method of claim 1, further comprising identifying a corrupted erasure correction subpacket.

6. The method of claim 5, further comprising correcting the corrupted erasure correction subpackets using a correction technique selected from the group consisting of forward error correction, automatic repeat request correction, and a combination thereof,
    wherein the correction technique is different from an erasure correction technique used to recreate the lost erasure correction subpacket.

7. The method of claim 1, wherein the erasure correction packet is generated by the transmitter system from the data packet using an erasure correction code.

8. The method of claim 7, wherein the erasure correction code includes a member selected from the group consisting of polynomial oversampling, parity checking, fountain codes, online codes, tornado codes, raptor codes, Luby transform codes, low density parity check codes, expander codes, Bose Ray-Chaudhuri Hocquenghem codes, Reed Solomon codes, and combinations thereof.

9. The method of claim 8, wherein the erasure correction code is a Bose Ray-Chaudhuri Hocquenghem code.

10. The method of claim 8, wherein the erasure correction code is a Reed Solomon code.

11. The method of claim 1, wherein the received erasure correction subpackets are from the multiple nodes that include a first node that relays at least one of the received erasure correction subpackets to another of the multiple nodes prior to the at least one received erasure correction subpacket being received by the receiver system.

12. The method of claim 1, wherein the received erasure correction subpackets are communicated hop-by-hop across the multiple nodes, and wherein the lost erasure correction subpacket is due to failure at one of the multiple nodes.

13. A transmitter system comprising:
    at least one processor to:
        generate an erasure correction packet from a data packet using an erasure correction code;
        split the erasure correction packet into a plurality of erasure correction subpackets; and
        cause transmission of the plurality of erasure correction subpackets across a plurality of network paths through a multi-hop network having a plurality of nodes, the plurality of nodes including a first node to relay at least one of the erasure correction subpackets to a second of the nodes prior to the at least one erasure correction subpacket being received by a receiver system, and wherein a subset of the plurality of erasure correction subpackets is useable by the receiver system to recreate a lost one of the plurality of error correction subpackets.

14. The transmitter system of claim 13, wherein the plurality of network paths include wireless network paths.

15. The transmitter system of claim 13, wherein the plurality of network paths include wired network paths.

16. The transmitter system of claim 13, wherein the plurality of network paths include wired network paths and wireless network paths.

17. The transmitter system of claim 13, wherein the plurality of erasure correction subpackets enable recreation of the lost erasure correction subpacket using an erasure correction decoding technique that is different from a forward error correction technique.

18. The transmitter system of claim 13, wherein the plurality of erasure correction subpackets enable recreation of the lost erasure correction subpacket using an erasure correction decoding technique that is different from an automatic repeat request technique.

19. A receiver system comprising:
   at least one processor to:
      receive erasure correction subpackets from a plurality of network paths traversing multiple nodes of a multi-hop network, wherein the received erasure correction subpackets are a subset of a plurality of erasure correction subpackets split by a transmitter system from an erasure correction packet generated from a data packet using an erasure correction code;
      recreate a lost one of the plurality of erasure correction subpackets using the received erasure correction subpackets; and
      regenerate the data packet from the received erasure correction subpackets and the recreated erasure correction subpacket.

20. The receiver system of claim 19, wherein the received erasure correction subpackets are from the multiple nodes that include a first node that relays at least one of the received erasure correction subpackets to another of the multiple nodes prior to the at least one received erasure correction subpacket being received by the receiver system.

21. The receiver system of claim 19, wherein the received erasure correction packets are communicating hop-by-hop across the multiple nodes, and wherein the lost erasure correction subpacket is due to failure at one of the multiple nodes.

22. The receiver system of claim 19, wherein the at least one processor is to further:
   identify a corrupted erasure correction subpacket; and
   correct the corrupted erasure correction subpacket using forward error correction,
   wherein the forward error correction is different from an erasure correction technique used to recreate the lost erasure correction subpacket.

23. The receiver system of claim 19, wherein the erasure correction code is a Bose Ray-Chaudhuri Hocquenghem code.

24. The receiver system of claim 22, wherein the erasure correction code is a Reed-Solomon code.

* * * * *

UNITED STATES PATENT AND TRADEMARK OFFICE
CERTIFICATE OF CORRECTION

PATENT NO. : 8,392,800 B2
APPLICATION NO. : 12/582035
DATED : March 5, 2013
INVENTOR(S) : Raul Hernan Etkin Page 1 of 1

It is certified that error appears in the above-identified patent and that said Letters Patent is hereby corrected as shown below:

In the Claims:

In column 6, line 20, in Claim 6, delete "subpackets" and insert -- subpacket --, therefor.

In column 8, line 23, in Claim 23, delete "claim 19," and insert -- claim 22, --, therefor.

Signed and Sealed this
Thirteenth Day of August, 2013

Teresa Stanek Rea
*Acting Director of the United States Patent and Trademark Office*